US008494022B2

(12) United States Patent
Shimizu et al.

(10) Patent No.: US 8,494,022 B2
(45) Date of Patent: Jul. 23, 2013

(54) SURFACE EMITTING LASER, SURFACE EMITTING LASER ARRAY, LIGHT SOURCE AND OPTICAL MODULE

(75) Inventors: Hitoshi Shimizu, Tokyo (JP); Takeo Kageyama, Kanagawa (JP); Keishi Takaki, Tokyo (JP); Norihiro Iwai, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 104 days.

(21) Appl. No.: 13/075,302

(22) Filed: Mar. 30, 2011

(65) Prior Publication Data
US 2011/0241564 A1   Oct. 6, 2011

(30) Foreign Application Priority Data
Mar. 31, 2010   (JP) .................................. 2010-081291

(51) Int. Cl.
*H01S 5/00* (2006.01)

(52) U.S. Cl.
USPC ................ 372/50.124; 372/45.01; 372/50.11; 372/102

(58) Field of Classification Search
USPC ................................................... 372/50.124
See application file for complete search history.

(56) References Cited

U.S. PATENT DOCUMENTS

| 5,568,499 | A  | * | 10/1996 | Lear ............................. 372/45.01 |
| 6,169,756 | B1 | * | 1/2001  | Chirovsky et al. ........ 372/46.015 |
| 2002/0064193 | A1 | * | 5/2002  | Diaz et al. ........................ 372/26 |
| 2003/0185269 | A1 | * | 10/2003 | Gutin .............................. 372/108 |
| 2007/0036189 | A1 | * | 2/2007  | Hori et al. ................... 372/50.11 |
| 2008/0212633 | A1 | * | 9/2008  | Shimizu et al. ........... 372/45.011 |

OTHER PUBLICATIONS

Suzuki, N. et al. "25-Gbps operation of a 1.1 μm-range InGaAs VCSELs for high-speed optical interconnections" NEC System Device Res. Labs., NEC Corporation, OFA4, OFC2006, 2006.

* cited by examiner

*Primary Examiner* — Xinning Niu
(74) *Attorney, Agent, or Firm* — Lowe Hauptman Ham & Berner, LLP

(57) ABSTRACT

A surface emitting laser is formed of a composition in which bandgap energy of layers from immediately above a current confinement layer to a second conductivity type contact layer is reduced towards the second conductivity type contact layer in a stacking direction, and a composition in which bandgap energy of layers from immediately below the current confinement layer to a first conductivity type contact layer is reduced towards the first conductivity type contact layer in a stacking direction while bypassing a quantum well layer or a quantum dot of an active layer, and includes a second conductivity type cladding layer including a material for reducing the mobility of carriers.

39 Claims, 9 Drawing Sheets

| | DIFFERENTIAL RESISTANCE DURING 10G MODULATION (min/max/dif; Ω) | | | VARIATION AT 25 TO 90C (Ω) |
|---|---|---|---|---|
| | 25°C | 50°C | 90°C | |
| EXAMPLE | 64/54/10 | 62/54/8 | 64/58/6 | 10 |
| COMPARATIVE EXAMPLE 1 | 82/66/16 | 83/69/14 | 85/73/12 | 19 |
| COMPARATIVE EXAMPLE 2 | 162/152/10 | 138/132/6 | 174/180/-6 | 48 |
| COMPARATIVE EXAMPLE 3 | 104/60/44 | - | - | 44 OR MORE |

SURFACE EMITTING LASER, SURFACE EMITTING LASER ARRAY, LIGHT SOURCE AND OPTICAL MODULE

CROSS-REFERENCE TO RELATED APPLICATION

This application is based upon and claims the benefit of priority from the prior Japanese Patent Application No. 2010-081291, filed on Mar. 31, 2010; the entire contents of which are incorporated herein by reference.

BACKGROUND OF THE INVENTION

1. Field of the Invention

The present invention relates to a surface emitting laser, and a surface emitting laser array, a light source, and an optical module using the surface emitting laser.

2. Description of the Related Art

Surface emitting lasers that emit laser light at a wavelength in 850 nm band have been mainly used as light sources for optical interconnection. An integrated circuit (IC) driver normally drives the surface emitting laser of 850 nm band at 3.3 volts, with respect to the energy bandgap of a GaAs based quantum well of an active layer of the surface emitting laser.

However, not only the surface emitting lasers for optical interconnection, but all the surface emitting lasers are desired to reduce power consumption in the market. To reduce power consumption in such surface emitting lasers, a method of using a surface emitting laser having an oscillation wavelength of equal to or more than 850 nanometers, in which the energy bandgap of the active layer is lowered, and that can further reduce the bias voltage has been studied. By using a strained InGaAs quantum well for the active layer in order to increase the oscillation wavelength, a differential gain is increased and the power consumption can be further reduced.

Conventional surface emitting lasers having a wavelength of equal to or more than 850 nanometers have a structure disclosed in, for example, "25-Gbps operation of 1.1-μm-range InGaAs VCSELs for high-speed optical interconnections" by N. Suzuki, et al., OFA4, OFC2006. The surface emitting laser includes a selectively-oxidized current confinement layer. In the surface emitting laser, distributed bragg reflector (DBR) mirrors that are multilayer film reflection mirrors formed of a periodic structure of a high refractive index layer and a low refractive index layer are used as an optical resonator, and a p-side electrode is formed above the upper DBR mirror.

SUMMARY OF THE INVENTION

It is an object of the present invention to at least partially solve the problems in the conventional technology.

In accordance with one aspect of the present invention, a surface emitting laser comprising: a substrate; a lower multilayer film reflection mirror formed on the substrate and formed of a periodic structure of a high refractive index layer and a low refractive index layer; a first conductivity type contact layer formed on the lower multilayer film reflection mirror; a first conductivity type cladding layer formed on the first conductivity type contact layer; an active layer formed on the first conductivity type cladding layer; a second conductivity type cladding layer formed on the active layer; a current confinement layer formed on the second conductivity type cladding layer and including a current injection portion made of a material including Al and a current confinement portion made of Al oxide formed by a selective thermal oxidation process; a second conductivity type contact layer formed on the current confinement layer; an upper multilayer film reflection mirror formed on the second conductivity type contact layer and formed of a periodic structure of a high refractive index layer and a low refractive index layer; a second conductivity type side electrode formed on the second conductivity type contact layer; and a first conductivity type side electrode formed on the first conductivity type contact layer, wherein layers from immediately above the current confinement layer to the second conductivity type contact layer comprise a composition in which bandgap energy is reduced towards the second conductivity type contact layer in a stacking direction, layers from immediately below the current confinement layer to the first conductivity type contact layer comprise a composition in which bandgap energy is reduced towards the first conductivity type contact layer in a stacking direction, while bypassing a quantum well layer or a quantum dot of the active layer, and the second conductivity type cladding layer includes a material for reducing mobility of a carrier.

The above and other objects, features, advantages and technical and industrial significance of this invention will be better understood by reading the following detailed description of presently preferred embodiment of the invention, when considered in connection with the accompanying drawings.

DETAILED DESCRIPTION OF THE PREFERRED EMBODIMENTS

Exemplary embodiments of the present invention will be described below in greater detail with reference to the accompanying drawings. However, the present invention is not limited to the embodiments, and various modifications may be made within the spirit and scope of the present invention.

When a bias current equal to or larger than a threshold current is applied to a surface emitting laser having a conventional structure, the element resistance changes according to the current value and the ambient temperature. Accordingly, when a modulation voltage serving as a signal is applied to the element, the modulation voltage to be applied must be increased or the bias current must be increased. Consequently, the power consumption is increased.

Figure 19:
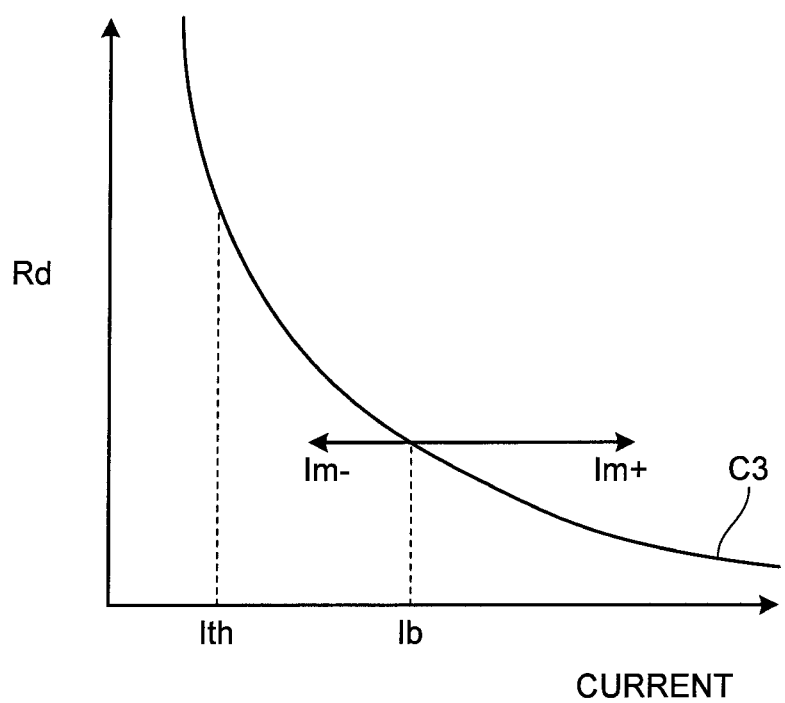
FIG. 19 is a graph showing I-Rd characteristics of a surface emitting laser having a conventional structure.

FIG. 19 is a graph showing the characteristics of the differential resistance (I-Rd characteristics) relative to the current of the surface emitting laser having the conventional structure. In FIG. 19, a line C3 shows the I-Rd characteristics. As shown in FIG. 19, the surface emitting laser has a sloped characteristic in which the differential resistance is reduced with the increase of current. Consideration is made when a predetermined bias voltage as well as a modulation voltage having approximately the same amplitude Vm in the positive and negative directions around the bias voltage as a center are applied to the surface emitting laser, to output a laser signal light from the surface emitting laser. In this case, a bias current Ib equal to or larger than a threshold current Ith and a modulation current corresponding to the amplitude Vm flow to the surface emitting laser. However, as shown in FIG. 19, the differential resistance characteristic of the surface emitting laser is sloped. Accordingly, a modulation current Im+ corresponding to the amplitude +Vm in the positive direction and a modulation current Im− corresponding to the amplitude −Vm in the negative direction become asymmetric. As a result, the amplitudes of the intensity of the output laser signal light in the positive and negative directions around the bias current as a center also become asymmetric. Consequently, the average modulation current to obtain optical signals with the same extinction ratio is increased, thereby increasing the power consumption.

The area size of a current injection region of an edge emitting type laser is 10 times larger or more than that of the surface emitting laser. Accordingly, in the edge emitting type laser, it is possible to easily obtain differential resistance of equal to or less than 5 ohms, thereby reducing the differential resistance variation. However, in the surface emitting laser, it is not possible to reduce the differential resistance variation and to obtain the differential resistance equal to or less than 70 ohms when the modulation rate is equal to or more than 10 gigahertz.

Figure 1:
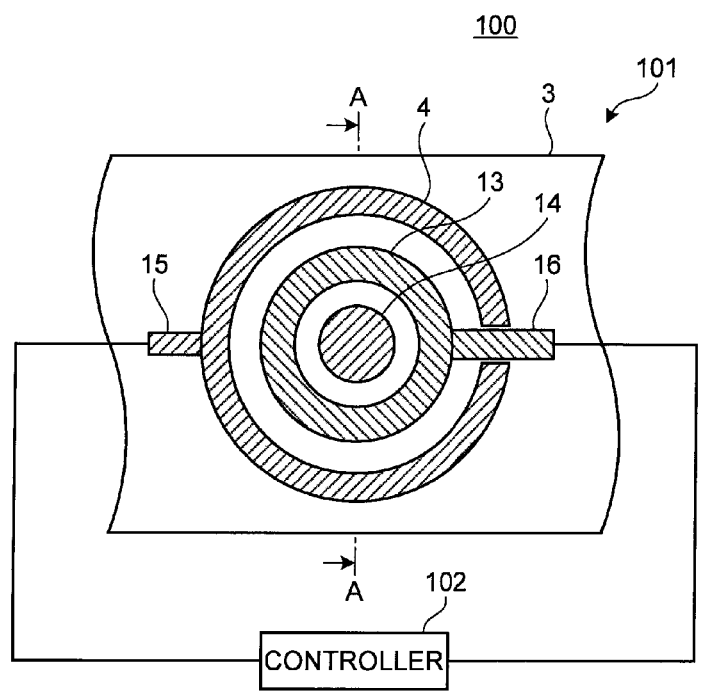
FIG. 1 is a schematic of a light source according to a first embodiment of the present invention.
Figure 2:
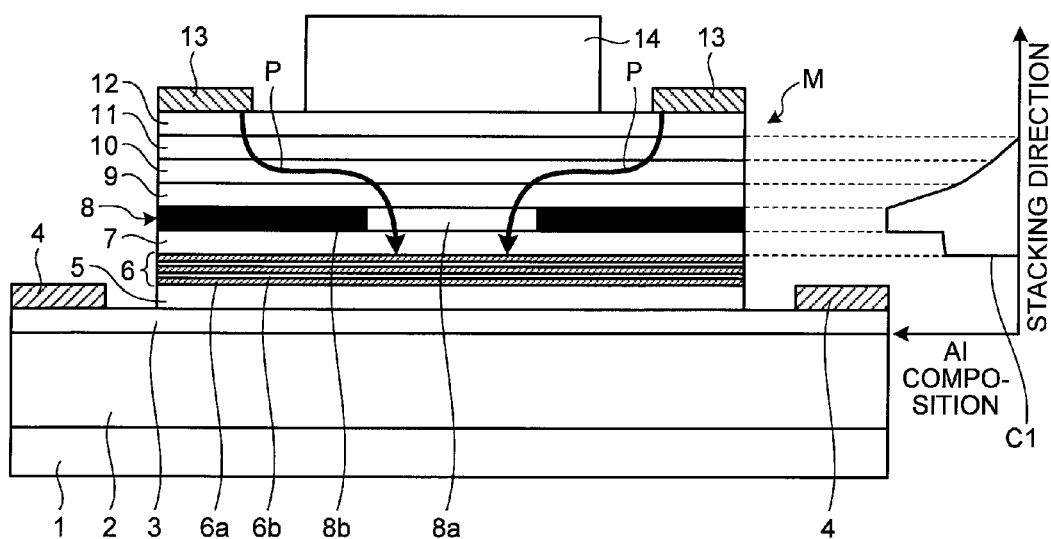
FIG. 2 is a cross-sectional view of an essential portion of a surface emitting laser in FIG. 1 along a line A-A.

FIG. 1 is a schematic of a light source 100 according to a first embodiment of the present invention. As shown in FIG. 1, the light source 100 includes a surface emitting laser 101 and a controller 102 that controls the surface emitting laser 101. FIG. 2 is a cross-sectional-view of an essential portion of the surface emitting laser 101 in FIG. 1 along a line A-A.

As shown in FIGS. 1 and 2, the surface emitting laser 101 includes an undoped lower DBR mirror 2 functioning as a lower multilayer film reflection mirror stacked on an n-type GaAs substrate 1 having a plane orientation (001), an n-type contact layer 3, an n-side electrode 4, an n-type cladding layer 5, an active layer 6, a p-type cladding layer 7, a current confinement layer 8, a p-type spacer layer 9, a p-type high conductivity layer 10, a p-type spacer layer 11, a p-type contact layer 12, a p-side electrode 13, an upper DBR mirror 14 functioning as an upper multilayer film reflection mirror, an n-side wiring electrode 15, and a p-side wiring electrode 16. Among these, a stacking structure of layers from the n-type cladding layer 5 to the p-type contact layer 12 is formed as a mesa post M having a columnar shape formed by etching processing and the like. The diameter of the mesa post is, for example, 30 micrometers. The n-type contact layer 3 is extended to the outer peripheral side of the mesa post M. The lower DBR mirror 2 and the upper DBR mirror 14 form an optical resonator.

The lower DBR mirror 2 is formed on an undoped GaAs buffer layer stacked on the n-type GaAs substrate 1. The lower DBR mirror 2 is formed as a semiconductor multilayer film mirror in which, for example, 40.5 layers of combined semiconductor layers each made of a pair of an $Al_{0.9}Ga_{0.1}As$ semiconductor layer functioning as a low refractive index layer and a GaAs semiconductor layer functioning as a high refractive index layer are stacked. The thickness of each of the layers of the combined semiconductor layers of the lower DBR mirror 2 is $\lambda/4n$ ($\lambda$ is oscillation wavelength and n is refractive index).

The n-type contact layer 3 is formed on the undoped lower DBR mirror 2 and made of an n-type GaAs material. The n-type cladding layer 5 is formed on the n-type contact layer 3 and made of an n-type GaAs material. The p-type cladding layer 7 is formed on the active layer 6 and made of a p-type AlGaAs material. The n-type cladding layer 5 and the p-type cladding layer 7 are formed so as to interpose the active layer 6 therebetween, thereby forming a separate confinement heterostructure (SCH).

The p-type spacer layer 9 is formed on the current confinement layer 8 and made of a p-type AlGaAs material. The p-type high conductivity layer 10 is formed on the p-type spacer layer 9 and made of a p-type AlGaAs material. The p-type spacer layer 11 is formed on the p-type high conductivity layer 10 and made of a p-type AlGaAs material. The p-type contact layer 12 is formed on the p-type spacer layer 11 and made of a p-type GaAs material. Compositions of the semiconductor layers will be described later.

The n-type cladding layer 5, the p-type cladding layer 7, and the p-type spacer layers 9 and 11 are doped with a p-type or an n-type dopant so that the carrier concentration is, for example, approximately $1\times10^{18}$ $cm^{-3}$. Accordingly, the n-type cladding layer 5, the p-type cladding layer 7, and the p-type spacer layers 9 and 11 surely have p-type or n-type conductivity. The carrier concentrations of the n-type contact layer 3 and the p-type contact layer 12 are, for example, approximately $2\times10^{18}$ cm$^3$ and $3\times10^{19}$ cm$^3$ in this order. The carrier concentration of the p-type high conductivity layer 10 is $3\times10^{19}$ cm$^3$ and its conductivity is higher than that of the p-type spacer layers 9 or 11. The p-type high conductivity layer 10 is a path of the current injected from the p-side electrode 13 in the transverse direction, and allows the current to be injected into the active layer 6 more effectively.

It is preferable that the carrier concentration of the p-type high conductivity layer 10 is equal to or more than $3\times10^{19}$ cm$^{-3}$ in view of high conductivity and low resistivity. It is also preferable that the carrier concentration thereof is equal to or less than $1\times10^{21}$ cm$^3$ to manufacture easily. If the carrier concentration is $3\times10^{19}$ cm$^3$, the resistivity of the p-type high conductivity layer 10 made of AlGaAs is $4\times10^{-3}\Omega\cdot$cm. Accordingly, if the layer thickness of the p-type high conductivity layer 10 is 30 nanometers, a value obtained by dividing the layer thickness by the resistivity is equal to or more than $7\times10^{-4}$ [1/$\Omega$]. Two or more p-type high conductivity layers may be provided.

The current confinement layer 8 has an opening portion 8a functioning as a current injection portion and a selectively oxidized layer 8b functioning as a current confinement portion. The opening portion 8a is formed of $Al_{1-x}$—$Ga_x$As ($0\leq x<1$) and the selectively oxidized layer 8b is formed of $(Al_{1-x}Ga_x)_2O_3$ (for example, x is 0.02). The thickness of the current confinement layer 8 is, for example, 30 nanometers, and the current confinement layer 8 is formed by performing a selective thermal oxidation process on an Al containing layer formed of $Al_{1-x}Ga_x$As. the selectively oxidized layer 8b is formed in a ring shape because the Al containing layer is oxidized from the outer peripheral portion as much as a predetermined area along the stacked surface. The selectively oxidized layer 8b has insulating characteristics, and the current density in the active layer 6 immediately below the opening portion 8a is increased, because the current injected from the p-side electrode 13 is confined and concentrated into the opening portion 8a. The diameter of the opening portion 8a is, for example, 6 micrometers.

The current confinement layer 8 is formed so that the distance from the center of the active layer 6 to the center of the current confinement layer 8 falls within a range from $\lambda/4n$ to $7\lambda/4n$. Here, n is an average refractive index from the active layer 6 to the current confinement layer 8. To improve reliability, it is preferable that the distance is equal to or more than $3\lambda/4n$, and to prevent the modulation efficiency from lowering, it is preferable that the distance is equal to or less than $7\lambda/4n$. The thickness of the other layers is adjusted, so that an antinode of a standing wave of light in the optical resonator is formed at the position of the active layer 6, and a node of the standing wave is formed at the positions of the current confinement layer 8 and the p-type high conductivity layer 10.

The active layer 6 has a multiple quantum well (MQW) structure in which three layers of quantum well layers 6a and two layers of barrier layers 6b are alternately stacked. The quantum well layer 6a is formed of a GaInAs based semiconductor material such as $Ga_{0.75}In_{0.25}$As. The barrier layer 6b is formed of, for example, GaAs. The active layer 6 emits spontaneous emission light including light having a wavelength of at least equal to or more than 850 nanometers, by the current injected from the p-side electrode 13 and confined by the current confinement layer 8.

The upper DBR mirror 14 is formed on the p-type contact layer 12. The upper DBR mirror 14 is formed as a dielectric multilayer film mirror in which, for example, nine layers of combined dielectric layers each made of pair of an $SiO_2$ layer functioning as a low refractive index layer and an SiN layer functioning as a high refractive index layer are stacked. Similar to the lower DBR mirror 2, the thickness of each layer of the upper DBR mirror 14 is $\lambda/4n$. The diameter of the upper DBR mirror 14 is smaller than the diameter of the p-type contact layer 12. Accordingly, the p-type contact layer 12 is extended to the outer peripheral side of the upper DBR mirror 14.

The p-side electrode 13 is formed on the surface of the extended portion of the p-type contact layer 12 as described above, in a ring-shape so as to surround the upper DBR mirror 14. The p-side electrode 13 is directly formed on the p-type contact layer 12 without interposing the upper DBR mirror 14 therebetween. The n-side electrode 4 is formed on the surface of the extended portion of the n-type contact layer 3 extended at the outer peripheral side of the mesa post M, and is formed in a C-shape so as to surround the periphery of the mesa post M. The n-side wiring electrode 15 is connected to the n-side electrode 4 and the p-side wiring electrode 16 is connected the p-side electrode 13.

The controller 102 is electrically connected to the p-side electrode 13 and the n-side electrode 4 through the n-side wiring electrode 15 and the p-side wiring electrode 16. The controller 102 is formed so as to apply a predetermined bias voltage and a modulation voltage serving as a signal having approximately the same amplitude in the positive and negative directions around the bias voltage as a center, between the p-side electrode 13 and the n-side electrode 4. The controller 102, for example, may be a known IC driver for driving a laser. The modulation rate of the modulation voltage is, for example, from 2.5 gigabits per second to 40 gigabits per second.

The compositions of the n-type contact layer 3, the n-type cladding layer 5, the p-type cladding layer 7, the p-type spacer layers 9 and 11, the p-type high conductivity layer 10, and the p-type contact layer 12 will now be described. The layers from the p-type spacer layer 9 immediately above the current confinement layer 8 to the p-type contact layer 12 are formed of $Al_{1-y}Ga_y$As ($x<y\leq1$). However, as described above, because the n-type contact layer 3 and the n-type cladding layer 5 are formed of GaAs, it is y=1. The layers from the p-type cladding layer 7 immediately below the current confinement layer 8 to the n-type contact layer 3 are formed of $Al_{1-z}Ga_z$As ($x<z\leq1$). However, it is $z\neq1$ in the p-type cladding layer 7 and the p-type cladding layer 7 includes Al. As described above, because the p-type contact layer 12 is formed of GaAs, it is z=1.

In FIG. 2, a line C1 indicates the distribution of Al composition in the stacking direction of the semiconductor layers. As indicated by the line C1, the Al composition is gradually reduced from the current confinement layer 8 towards the p-type contact layer 12 in a continuous manner. The Al composition is reduced from the current confinement layer 8 towards the n-type contact layer 3 in a stepwise manner. Because the Al composition is reduced in this manner, the bandgap energy is gradually reduced from the current confinement layer 8 towards the p-type contact layer 12 in a continuous manner. The bandgap energy is reduced from the current confinement layer 8 towards the n-type contact layer 3 in a stepwise manner bypassing the quantum well or the quantum dot. Because the Al composition or the bandgap energy is reduced, the Al composition or the bandgap energy does not increase along the way. Accordingly, the Al composition or the bandgap energy may be reduced in a continuous manner or in a stepwise manner. Here, "bypassing" means "skipping". For example, the change (reduction) of the Al composition or the bandgap energy is considered as "continuous" when the Al composition or the bandgap energy is continuously changed (reduced) along a virtual line which is drawn by skipping the quantum well or the quantum dot, even if the discontinuity of the Al composition or the bandgap energy exist at the quantum well or the quantum dot.

The controller 102 applies a bias voltage and a modulation voltage between the p-side electrode 13 and the n-side electrode 4, thereby injecting current. As indicated by a path P shown in FIG. 2, carriers (holes) at the P-side mainly move from the p-side electrode 13, pass through the p-type contact layer 12 and the p-type spacer layer 11, flow through the p-type high conductivity layer 10 having high conductivity in the transverse direction, then pass through the p-type spacer layer 9, and finally injected into the active layer 6, in a state in which the carriers are concentrated into the opening portion 8a of the current confinement layer 8 and the density thereof is increased. Carriers (electrons) at the n-side pass through the n-side electrode 4, the n-type contact layer 3, and the n-type cladding layer 5, and are injected into the active layer 6.

The active layer 6 into which the carriers are injected emits spontaneous emission light. The generated spontaneous emission light is optically amplified in the active layer 6 and made a roundtrip in the optical resonator, thereby oscillating a laser light. As a result, the surface emitting laser 101 emits a laser signal light including the modulation signal from above the upper DBR mirror 14.

As described above, the p-side electrode 13 is formed directly on the p-type contact layer 12 without interposing the upper DBR mirror 14 therebetween. The n-side electrode 4 is also formed directly on the n-type contact layer 3 without interposing the lower DBR mirror 2 therebetween. As a result, the number of hetero interfaces that are interfaces of different types of materials present between the p-side electrode 13 and the active layer 6, and between the n-side electrode 4 and the active layer 6, is reduced. The bandgap energy reduces monotonously from the current confinement layer 8 towards the p-type contact layer 12, and reduces monotonously from the current confinement layer 8 towards the n-type contact layer 3 bypassing the quantum well or the quantum dot. Accordingly, the band offset at the hetero interfaces is also changed monotonously.

Here, consideration is made when current is applied to the surface emitting laser having a conventional structure in which the p-side electrode is formed on the upper DBR mirror, for example, at a room temperature. The current is injected from the p-side electrode as holes. However, some holes are trapped at a large number of hetero interfaces present in the upper DBR mirror, thereby the differential resistance of the surface emitting laser increases. When the barrier energy at the hetero interfaces is $\phi B$, the differential resistance is proportional to $1/\exp(-\phi B/kT)$ (k is Boltzmann constant, T is absolute temperature, and $\phi B$ is approximately 60 milli-electron volts).

In general, the temperature of the surface emitting laser is increased as more current is injected. As a result, the holes gain thermal energy, thereby the proportion of the holes trapped at the hetero interfaces reduces. Accordingly, the differential resistance is also reduced as the formula mentioned above. In other words, the differential resistance of the conventional surface emitting laser is reduced corresponding to the increase of the driving current, and the I-Rd characteristics as shown in FIG. 19 are formed. For example, in the surface emitting laser disclosed in "25-Gbps operation of 1.1-µm-range InGaAs VCSELs for high-speed optical interconnections" by N. Suzuki, et al., OFA4, OFC2006, the number of hetero interfaces present between the p-side electrode and the active layer is quite a large number from approximately 70 to 210 just in the upper DBR mirror made of 35 pairs of layers.

In the surface emitting laser 101 according to the first embodiment, as described above, the number of hetero interfaces present between the p-side electrode 13 and the active layer 6 is significantly small compared to those of the conventional technique. The band offset at the hetero interfaces is also changed monotonously. Accordingly, the energy level in the path of the carriers does not have unevenness, and the energy level changes monotonously. As a result, the proportion of the holes trapped at the hetero interfaces is extremely small even at a room temperature. Consequently, even if the temperature of the element is increased, the differential resistance does not vary significantly. As for electrons, which are carriers injected from the n-side electrode 4, the number of hetero interfaces through which the electrons injected from the n-side electrode 4 to the active layer 6 pass is small, thereby the band offset also changes monotonously. As a result, the variation of the differential resistance is further reduced. It is preferable that the number of hetero interfaces present between the p-side electrode 13 and the active layer 6 is from 3 to 30.

In the surface emitting laser 101, as shown in the path P in FIG. 2, when carriers are injected from the p-side electrode 13 to the opening portion 8a of the current confinement layer 8, the carriers pass through the p-type high conductivity layer 10 having a low resistivity. After the current is confined by the opening portion 8a, the carriers are injected into the active layer 6 through the p-type cladding layer 7 formed of AlGaAs including Al. AlGaAs includes Al that is a chemical element for reducing the mobility of the carriers as a composition. Accordingly, the mobility of the carriers in AlGaAs is smaller compared to GaAs that does not include Al. Consequently, in the p-type cladding layer 7 formed of AlGaAs, the current is prevented from spreading in the transverse direction. As a result, even if the temperature of the element is changed, the current path does not vary and is stable. Accordingly, the variation of the differential resistance is further reduced.

If the distance from the center of the active layer 6 to the center of the current confinement layer 8 is set equal to or more than $3\lambda/4$, the reliability of the active layer 6 is preferably improved. Even if the distance between the current confinement layer 8 and the active layer 6 is separated in this manner, because the p-type cladding layer 7 is formed of AlGaAs including Al as described above, the current is prevented from spreading in the transverse direction.

The mobility $\mu$ of the holes in the p-type high conductivity layer 10 is proportional to $400(300/T)^{2.3}$, regardless of the semiconductor material thereof. Accordingly, if the temperature of the element is increased, the mobility is reduced, and the differential resistance is increased. When the differential resistance is increased, it acts so as to eliminate the reduction of the differential resistance due to the carrier trap at the hetero interfaces. Consequently, the variation of the differential resistance is reduced further more.

In the surface emitting laser 101 according to the first embodiment, the differential resistance varies only slightly relative to the current equal to or larger than the threshold current, under the combined actions as described above. If the wavelength of the surface emitting laser is equal to or more than 850 nm band, or in particular, equal to or more than 1000 nm band, the bandgap energy of the active layer is small. Accordingly, the bias voltage can be further reduced and the surface emitting laser 101 can be driven by lower power consumption.

Figure 3:
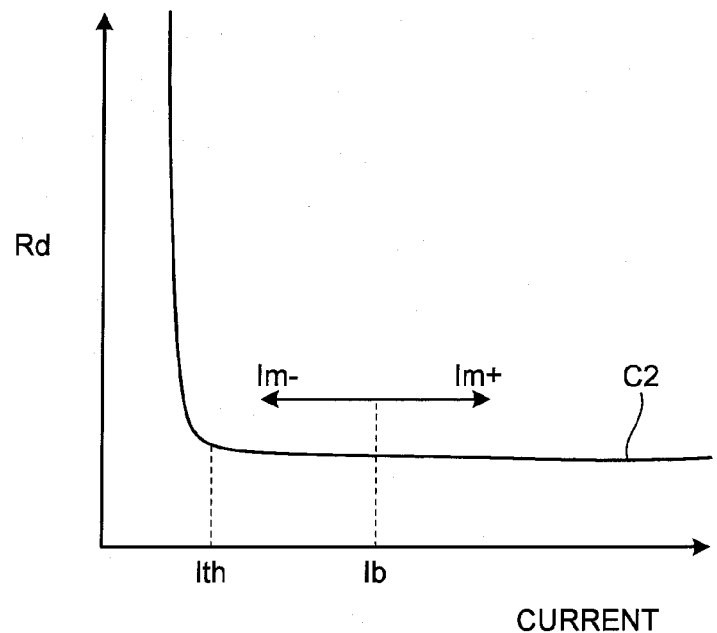
FIG. 3 is a graph showing I-Rd characteristics of the surface emitting laser according to the first embodiment.

FIG. 3 is a schematic graph showing I-Rd characteristics (line C2) of the surface emitting laser 101 according to the first embodiment. As shown in FIG. 3, the surface emitting laser 101 has characteristics in which the differential resistance is approximately constant regardless of the increase in current, in a current value equal to or larger than the threshold. Accordingly, when the controller 102 applies the modulation voltage having approximately the same amplitude Vm in the positive and negative directions around the bias voltage as a center, the modulation current Im+ corresponding to the amplitude +Vm in the positive direction and the modulation current Im− corresponding to the amplitude −Vm in the negative direction are symmetrical relative to the bias current Ib. As a result, the optical power of the laser signal light to be output also has the amplitude symmetrical in the positive and negative directions around the optical intensity relative to the bias current as a center. As a result, it is possible to increase the extinction ratio and reduce the power consumption.

In this manner, the light source 100 according to the first embodiment can reduce the power consumption. Accordingly, the light source 100 is suitable as a light source for realizing high-speed transmission from 2.5 gigabits per second to 40 gigabits per second, more specifically, of equal to or more than 10 gigabits per second, by applying a high-rate modulation voltage from 2.5 gigahertz to 40 gigahertz, more specifically, of equal to or more than 10 gigahertz.

As described above, in the surface emitting laser 101 according to the first embodiment, the differential resistance varies only slightly with the temperature increase of the element. Accordingly, in the surface emitting laser 101, the differential resistance varies only slightly even if the ambient temperature is changed. Consequently, the ambient temperature dependence of the optical output during modulation is small. Further, The quantum well layer 6a in the active layer 6 is made of the GaInAs based semiconductor material in which the temperature-dependent change in the gain curve is small. Accordingly, not only the threshold current and threshold voltage are low, but also the ambient temperature dependence of current versus light-output (I-L) characteristics is small. Consequently, in the light source 100 according to the first embodiment, a temperature adjusting unit such as a Peltier element may be a unit with low power consumption, or the temperature adjusting unit may be unnecessary. Accordingly, the light source 100 can be made much simpler, consumes low power, and can be manufactured at low cost.

An example of a manufacturing method of the light source 100 according to the first embodiment will now be described. By using a known grown method such as a molecular beam epitaxy (MBE), a gas source MBE, a chemical beam epitaxy (CBE), and a metal-organic chemical vapor deposition (MOCVD), the lower DBR mirror 2, the n-type contact layer 3, the n-type cladding layer 5, the active layer 6, the p-type cladding layer 7, the Al containing layers made of $Al_{1-x}Ga_xAs$ for forming the current confinement layer 8, the p-type spacer layer 9, the p-type high conductivity layer 10, the p-type spacer layer 11, and the p-type contact layer 12 are sequentially grown on the n-type GaAs substrate 1 on which surface the undoped GaAs buffer layer is formed.

The p-side electrode 13 is then formed on the p-type contact layer 12 by using a lift-off method. The p-side electrode 13 is then covered by a SiN film, and the mesa post M of a columnar shape is formed by etching the layers to the depth of the n-type cladding layer 5 by using an acid etching liquid and the like.

The current confinement layer 8 is then formed by selectively oxidizing the Al containing layer from the outer peripheral side of the mesa post M by performing a thermal treatment in a water-vapor atmosphere. In this manner, the current confinement layer 8 can be easily and accurately formed into a desired shape by the selective thermal oxidation process.

The n-side electrode 4 is then formed on the surface of the n-type contact layer 3 at the outer peripheral side of the mesa post M, followed by forming the n-side wiring electrode 15 and the p-side wiring electrode 16.

After forming the upper DBR mirror 14, the underside surface of the n-type GaAs substrate 1 is polished to a desired thickness. The elements are then separated from one another, thereby completing the surface emitting laser 101. The light source 100 is then completed by connecting the surface emitting laser 101 and the controller 102 including a known IC driver for driving a laser.

As Example of the present invention, a light source having a structure similar to that of the first embodiment is formed by connecting the controller to the surface emitting laser manufactured by using the manufacturing method described above. The composition of the active layer, the thicknesses of the upper and lower DBR mirrors, and the cavity length of the optical resonator, and the like are adjusted, so that the laser oscillation wavelength λ is 1100 nanometers. The threshold current of the surface emitting laser according to the present Example is 0.3 milliamperes.

As Comparative Examples 1 and 2, surface emitting lasers having substantially the same structures as that of the surface emitting laser according to Example are manufactured. A surface emitting laser having an oscillation wavelength of 1300 nanometers (Comparative Example 1) is different from that of Example, in that the p-type cladding layer 7 in FIG. 1 is formed of GaAs not including Al. Another surface emitting laser having an oscillation wavelength of 1300 nanometers (Comparative Example 2) is different from that of Example, in that the carrier concentration of the p-type high conductivity layer is $1 \times 10^{19}$ $cm^3$. The light source is formed by connecting the controller to each of the surface emitting lasers. The composition of the active layer, the thicknesses of the upper and lower DBR mirrors, the cavity length of the optical resonator, and the like are adjusted, so that the laser oscillation wavelength λ is 1300 nanometers. The threshold currents of the surface emitting lasers according to Comparative Examples 1 and 2 are both 2.5 milliamperes. In Example and Comparative Examples, the surface emitting lasers having the oscillation wavelengths of 1100 nanometers and 1300 nanometers are used. Data at 1300 nanometers is an example when the active layer is GaInNAs. Accordingly, the crystallinity is deteriorated and the threshold current is high. If the active layer is InGaAs, the threshold current and the slope efficiency are the same when the oscillation wavelength is from 850 nanometers to 1220 nanometers, and the bias voltage is lowered as the wavelength is increased. Accordingly, it is possible to lower the power consumption.

As Comparative Example 3, a surface emitting laser different from the surface emitting laser according to Example is manufactured in which the upper DBR mirror is formed of a semiconductor material having a p-type conductivity and same as that of the lower DBR mirror, and the p-type contact layer and the p-side electrode are formed on the upper DBR mirror. The light source is formed by connecting the controller thereon. The composition of the active layer, the thicknesses of the upper and lower DBR mirrors, the cavity length of the optical resonator, and the like are adjusted, so that the laser oscillation wavelength λ, is 850 nanometers. The threshold current of the surface emitting laser according to Comparative Example 3 is 0.3 milliamperes.

The I-Rd characteristics of the surface emitting lasers according to Example and Comparative Examples are then measured. From the I-Rd characteristics, the differential resistance of the element is calculated, when a bias voltage and a modulation voltage are applied, so that the bias current is 5 milliamperes (Example and Comparative Example 3) or 7 milliamperes (Comparative Examples 1 and 2), and the modulation current is ±3 milliamperes, while assuming that the modulation is performed using a modulation voltage of 10 gigabits per second (hereinafter, referred to as "10G modulation"). At this time, the modulation degree is 60% (Example and Comparative Example 3) or approximately 43% (Comparative Examples 1 and 2). The ambient temperatures are 25 degrees Celsius, 50 degrees Celsius, and 90 degrees Celsius (only 25 degrees Celsius in Comparative Example 3).

Figure 4:
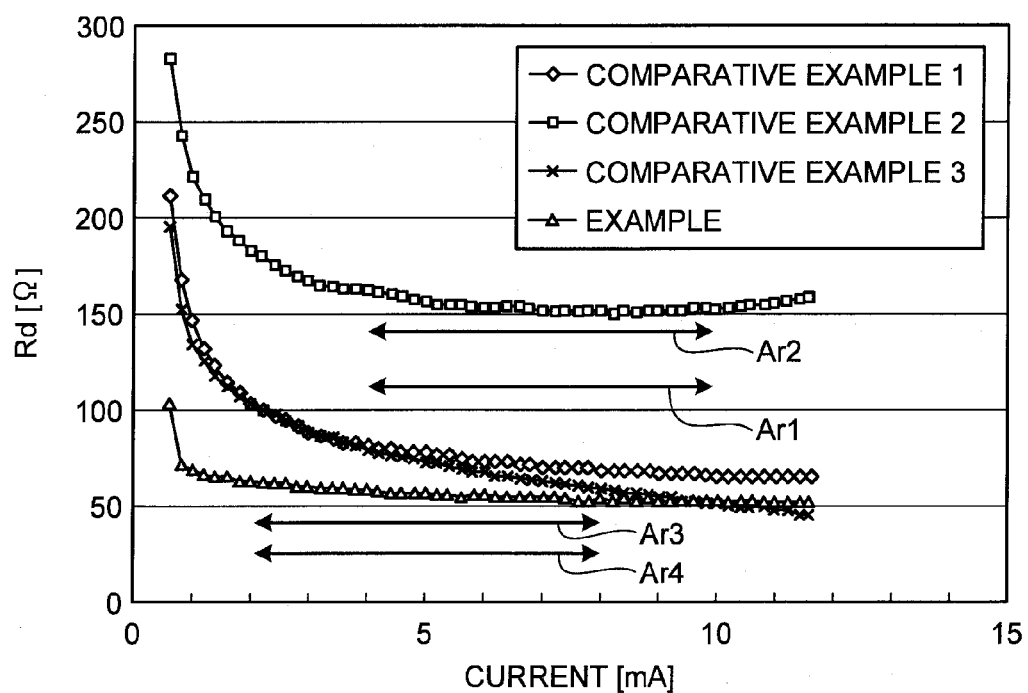
FIG. 4 is a graph showing I-Rd characteristics of the surface emitting lasers according to Example and Comparative Examples 1 to 3 at ambient temperature of 25 degrees Celsius.
Figure 5:
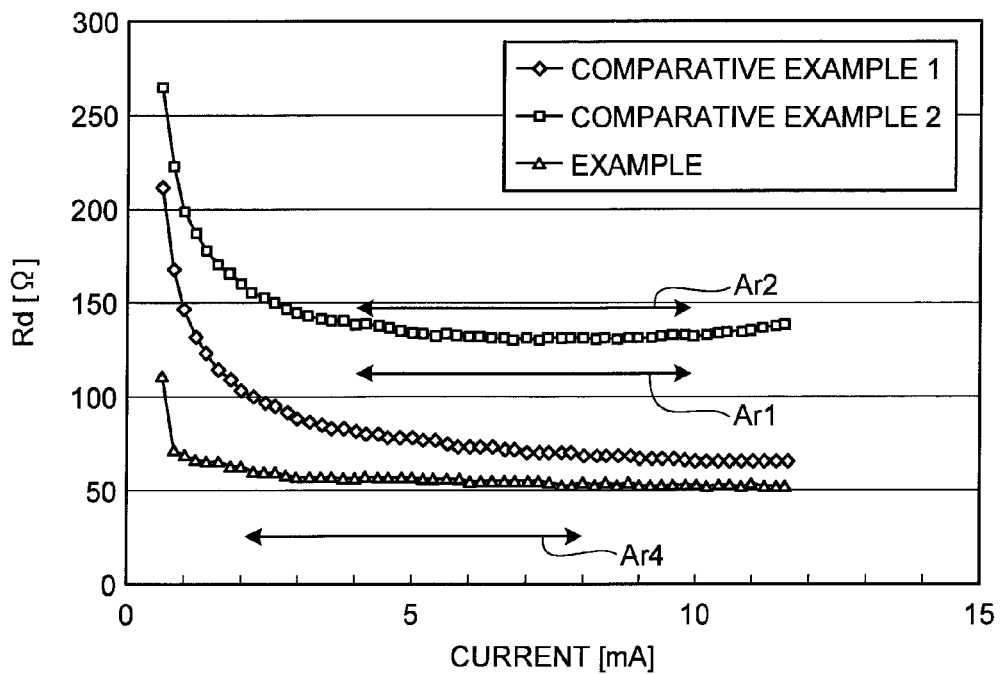
FIG. 5 is a graph showing I-Rd characteristics of the surface emitting lasers according to Example and Comparative Examples 1 and 2 at ambient temperature of 50 degrees Celsius.
Figure 6:
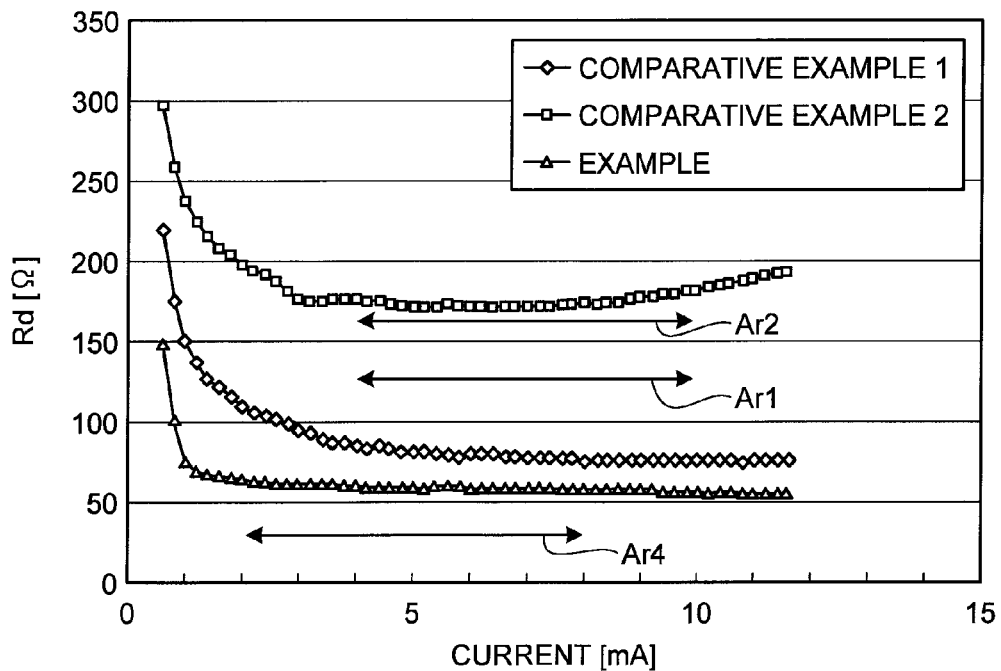
FIG. 6 is a graph showing I-Rd characteristics of the surface emitting lasers according to Example and Comparative Examples 1 and 2 at ambient temperature of 90 degrees Celsius.

FIG. 4 is a graph showing the I-Rd characteristics of the surface emitting lasers according to Example and Comparative Examples 1 to 3 at ambient temperature of 25 degrees Celsius. FIG. 5 is a graph showing the I-Rd characteristics of the surface emitting lasers according to Example and Comparative Examples 1 and 2 at ambient temperature of 50 degrees Celsius. FIG. 6 is a graph showing the I-Rd characteristics of the surface emitting lasers according to Example and Comparative Examples 1 and 2 at ambient temperature of 90 degrees Celsius. In FIGS. 4 to 6, each of arrows Ar1 to Ar4 indicates the range of current applied to the surface emitting lasers according to Comparative Examples 1 to 3 and Example.

As shown in FIGS. 4 to 6, similar to FIG. 19, the surface emitting lasers according to Comparative Examples 1 and 3 have sloped I-RD characteristics in which the differential resistance is largely reduced with the increase in current. The surface emitting laser according to Comparative Example 2 has the I-Rd characteristics in which the differential resistance varies slightly with the change in current, but the differential resistance varies largely with the change in ambient temperature. In contrast, the surface emitting laser according to Example of the present invention has I-Rd characteristics in which the differential resistance varies slightly with both the change in current and the change in ambient temperature. At this time, the differential resistance is flat across a range of current from 1 milliampere to 3 milliamperes through equal to or more than 10 milliamperes.

Figures 7, 8:
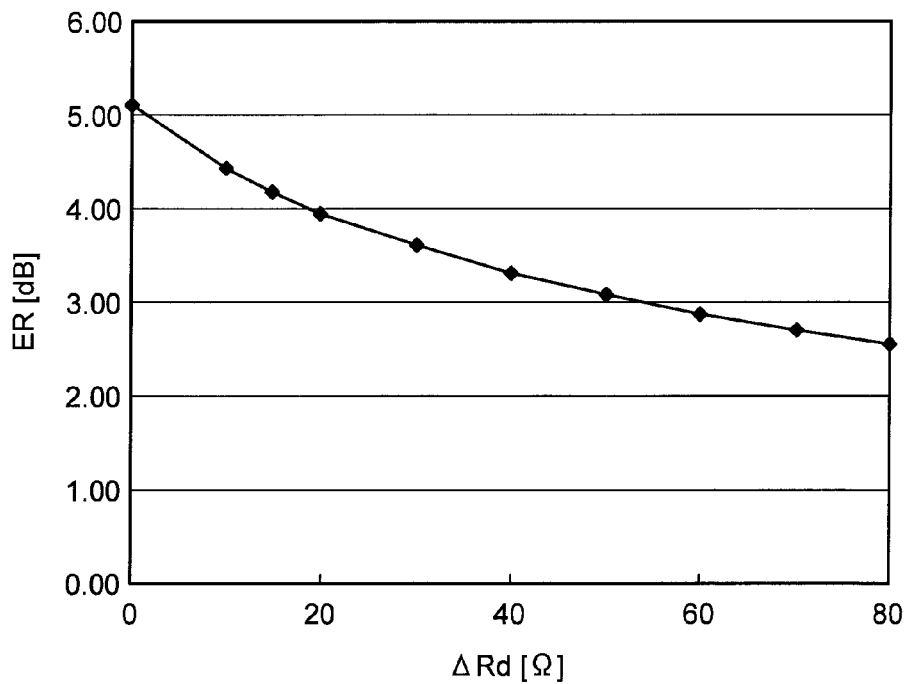
FIG. 7 is a table showing differential resistance during 10G modulation in the I-Rd characteristics shown in FIGS. 4 to 6, and variations of the differential resistance.
FIG. 8 is a graph showing a relationship between the variations of the differential resistance (ΔRd) and the extinction ratio of the output laser signal light, when a predetermined bias voltage and a modulation voltage are applied, in a light source having the same structure as that of the light source according to the first embodiment.

FIG. 7 is a table showing the differential resistance and the variation of the differential resistance, during 10G modulation in the I-Rd characteristics shown in FIGS. 4 to 6, in other words, when the current is changed within a range of the arrows Ar1 to Ar4 shown in FIGS. 4 to 6. At each ambient temperature, values sequentially indicate differential resistance when the current has a minimum value (min), differential resistance when the current has a maximum value (max), and a difference value (dif) defined by subtracting (max) from (min). The variation at 25-90 degrees Celsius is a difference between the maximum value and the minimum value of the differential resistance between 25 degrees Celsius and 90 degrees Celsius.

As shown in FIG. 7, the surface emitting lasers according to Comparative Examples 1 to 3 have high differential resistance and the variations are 19 ohms, 48 ohms, and equal to or more than 44 ohms, that are large amounts. In contrast, in the surface emitting laser according to Example of the present invention, the differential resistance is equal to or less than 70 ohms at maximum, the variation is small at 10 ohms, and the difference between "min" and "max" is equal to or less than 17% of min. The values shown in FIG. 7 are not dependent on the oscillation wavelength but are dependent on modulation frequency. For example, to perform modulation at 10 gigabits per second, the current injection efficiency at a relaxation oscillation frequency is improved by reducing the diameter of the oxide aperture (diameter of an opening portion of the current confinement layer) smaller than that of the surface emitting laser for performing modulation at 2.5 gigabits per second, thereby making the volume of the active layer smaller. However, the resistance is increased to that extent by the reduction.

As the results in FIGS. 4 to 7, in the surface emitting laser according to Example of the present invention, the differential resistance varies slightly with the change in current and the change in ambient temperature. Accordingly, it is possible to drive at 10 gigabits per second without adjusting the voltage modulation of generally used ±0.1 volts, over the entire ambient temperature range (from 25 degrees Celsius to 90 degrees Celsius). Consequently, the IC driver can be made simple and consumes low power.

It is preferable that the variation of the differential resistance relative to the change in a predetermined ambient temperature (for example, from 25 degrees Celsius to 90 degrees Celsius) is equal to or less than 15 ohms as the surface emitting laser according to Example described above.

FIG. 8 is a graph showing a calculation result of a relationship between the variation of the differential resistance ($\Delta Rd$) in the modulation range and the extinction ratio (ER) of the output laser signal light, when a light source having the same structure as that of the first embodiment is modulated by a modulation voltage of ±0.1 volts around the bias current (5 milliamperes) as a center. This is calculated assuming that the threshold current is 1.2 milliamperes and the differential resistance at the maximum current is 50 ohms. Under the 10 Gb Ethernet standard, the extinction ratio is required to be equal to or more than 4 decibels.

As shown in FIG. 8, when the differential resistance variation is equal to or less than 15 ohms within the range of ambient temperature (from 25 degrees Celsius to 90 degrees Celsius) around the bias current as a center, it is possible to set the extinction ratio to equal to or more than 4 decibels, which is the 10 Gb Ethernet standard, even at ±0.1 volts that is the normal modulation amplitude of the IC driver. If the differential resistance variation is greater than this, the extinction ratio is reduced, and the modulation voltage amplitude must be increased or the bias current must be increased. By doing so, the power consumption is increased. From the viewpoint of lowering the power consumption, it is preferable that the modulation voltage amplitude is equal to or less than ±0.1 volts. However, the modulation voltage amplitude may also be equal to or less than ±0.2 volts.

In the first embodiment, AlGaAs used for forming the p-type cladding layer 7, the p-type spacer layers 9 and 11, the p-type high conductivity layer 10, and the like is alloy. However, the layers made of AlGaAs can be formed of digital alloy. The digital alloy may be formed of thin layers each of which has the thickness equal to or less than 2.5 nanometers. A mini-band is formed by the tunneling effect. For example, if a pair of a GaAs layer having the thickness of 1.5 nanometers and an AlAs layer having the thickness of 1 nanometer is repeatedly arranged 10 times, an AlGaAs layer with an average Al composition of 40% and having the thickness of 25 nanometers can be obtained. The AlGaAs layer having the average composition may have a gradient composition as in FIG. 2. If there is only one AlGaAs layer having the thickness equal to or less than 2.5 nanometers and having a high Al composition (such as 80%), carriers can be injected through the AlGaAs layer by the tunneling effect. Accordingly, the AlGaAs layer does not contribute to the increase in resistance. In this case, the AlGaAs layer can be ignored.

The surface emitting laser according to the present invention can also be directly modulated in the range from 2.5 gigabits per second to 40 gigabits per second.

Figure 9:
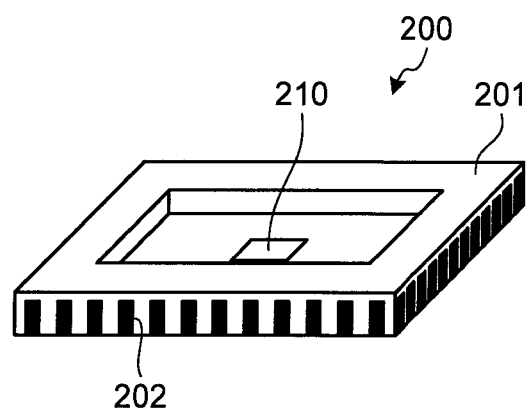
FIG. 9 is a schematic perspective view of a surface emitting laser array device according to a second embodiment of the present invention.

A surface emitting laser array device including surface emitting lasers according to an embodiment of the present invention and that is used as a signal light source for optical interconnection and the like will now be described as a second embodiment of the present invention. FIG. 9 is a schematic perspective view of the surface emitting laser array device according to the second embodiment. As shown in FIG. 9, a surface emitting laser array device 200 includes a surface emitting laser array chip 210 which is mounted on a known flat package 201 called a ceramic leaded chip carrier (CLCC). The surface emitting laser array chip 210 is connected to a metal caster (electrode) 202 through a wire (not shown).

Figure 10:
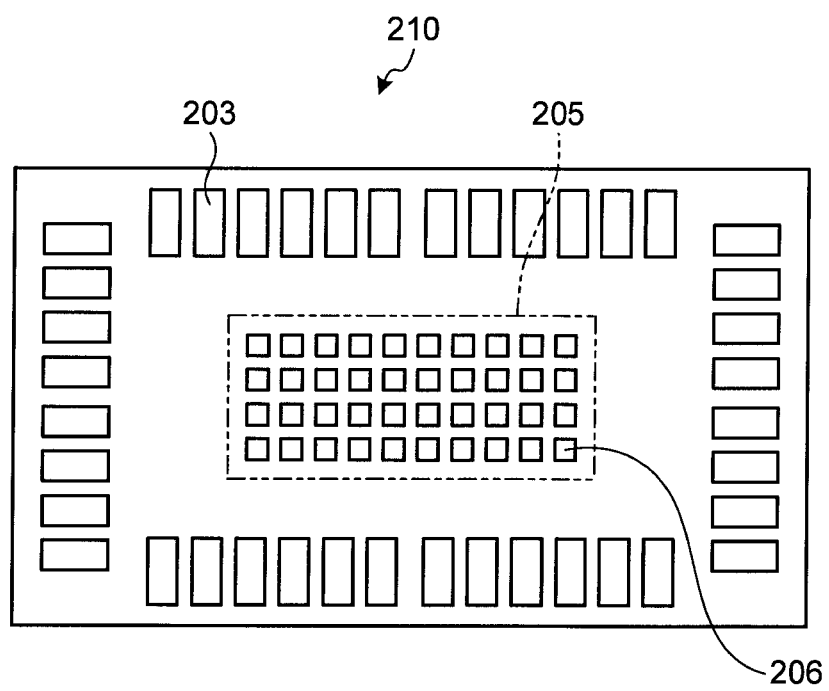
FIG. 10 is a schematic plan view of the surface emitting laser array device shown in FIG. 9.

FIG. 10 is a schematic plan view of the surface emitting laser array chip 210 shown in FIG. 9. As shown in FIG. 10, the surface emitting laser array chip 210 includes a surface emitting laser array portion 205 that is arranged at the center and that is formed by two-dimensionally arranging 40 elements of surface emitting lasers 206 according to the embodiment of the present invention. The surface emitting laser array chip 210 also includes a plurality of electrode pads 203 which are provided at the periphery of the surface emitting laser array portion 205 and each of which is connected with the electrode of each of the surface emitting lasers 206 in the surface emitting laser array portion 205 through a wire. Each of the electrode pads 203 is connected to the metal caster 202 of the flat package 201. The metal caster 202 is electrically connected to an external control circuit (not shown) to control the emission from the surface emitting lasers 206. For example, the surface emitting laser 101 according to the first embodiment may be used as the surface emitting laser 206.

A bias voltage and a modulation voltage are applied to the surface emitting lasers 206 of the surface emitting laser array portion 205 from the external control circuit through the metal caster 202 and the electrode pads 203. Each of the surface emitting lasers 206 then emits a laser signal light of a predetermined wavelength from the upper side.

The surface emitting laser array device 200 uses the surface emitting lasers 206 according to the embodiment of the present invention capable of outputting high quality optical signals by a simple control. Accordingly, the surface emitting laser array device 200 including the control circuit can be made simple, consumes low power, and can be manufactured at low cost.

In the surface emitting laser array portion 205 of the surface emitting laser array device 200, the surface emitting lasers 206 are two-dimensionally arranged. However, the surface emitting lasers 206 may be arranged one-dimensionally. The number of the surface emitting lasers 206 that form the surface emitting laser array portion 205 is not particularly limited. For example, in the current optical module, a signal light source in which 4 to 15 elements of surface emitting lasers are one-dimensionally arranged is suitably used as a signal light source for optical interconnection.

Figure 11:
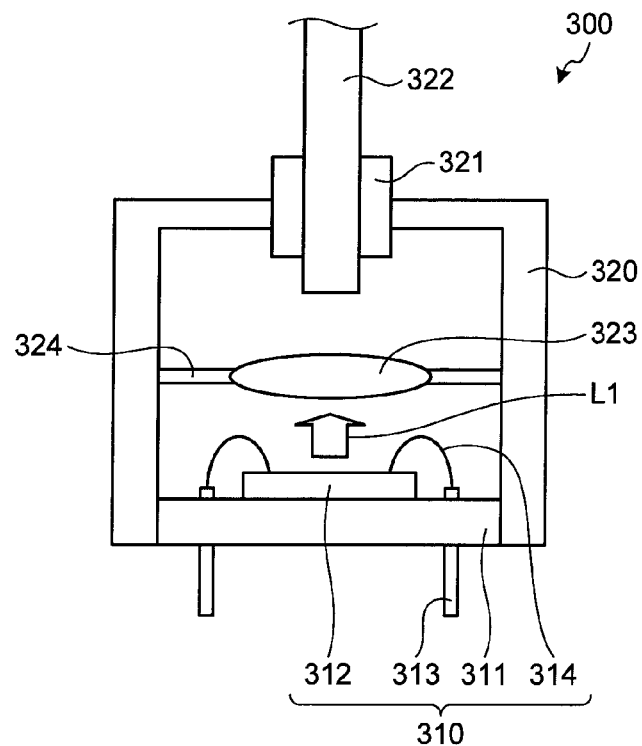
FIG. 11 is a schematic cross-sectional view of a surface emitting laser package according to a third embodiment of the present invention.

A surface emitting laser package that is a light source including a surface emitting laser according to an embodiment of the present invention and that is used as a signal light source for optical interconnection and the like will now be described as a third embodiment of the present invention. FIG. 11 is a schematic cross-sectional view of a surface emitting laser package 300 according to the third embodiment. As shown in FIG. 11, the surface emitting laser package 300 includes a surface emitting laser 312 according to an embodiment of the present invention, a substrate 311 for mounting the surface emitting laser 312, an electrode 313 provided on the substrate 311, a surface emitting laser module 310 that includes a wire 314 for connecting the surface emitting laser 312 and the electrode 313, a housing 320 to house the surface emitting laser module 310, a lens 323 placed above the surface emitting laser module 310 and that is held in the housing 320 by arms 324, an optical fiber mount 321 provided at the upper portion of the housing 320, and an optical fiber 322 inserted into and held by the optical fiber mount 321. The electrode 313 is electrically connected to the external control circuit (not shown) to control the emission state of the surface emitting laser module 310. For example, the surface emitting laser 101 according to the first embodiment may be used as the surface emitting laser 312.

A bias voltage and a modulation voltage are applied to the surface emitting laser 312 from the external control circuit through the electrode 313 and the wire 314. The surface emitting laser 312 then emits a laser signal light L1 having a predetermined wavelength from the upper side. The lens 323 condenses the laser signal light L1 and couples it into the optical fiber 322. The optical fiber 322 transmits the coupled laser signal light L1 to outside.

The surface emitting laser package 300 uses the surface emitting laser 312 according to the embodiment of the present invention capable of outputting high quality optical signals by a simple control. Accordingly, the surface emitting laser package 300 can have a simple configuration including the control circuit, consumes low power, and can be manufactured at low cost.

Figure 12:
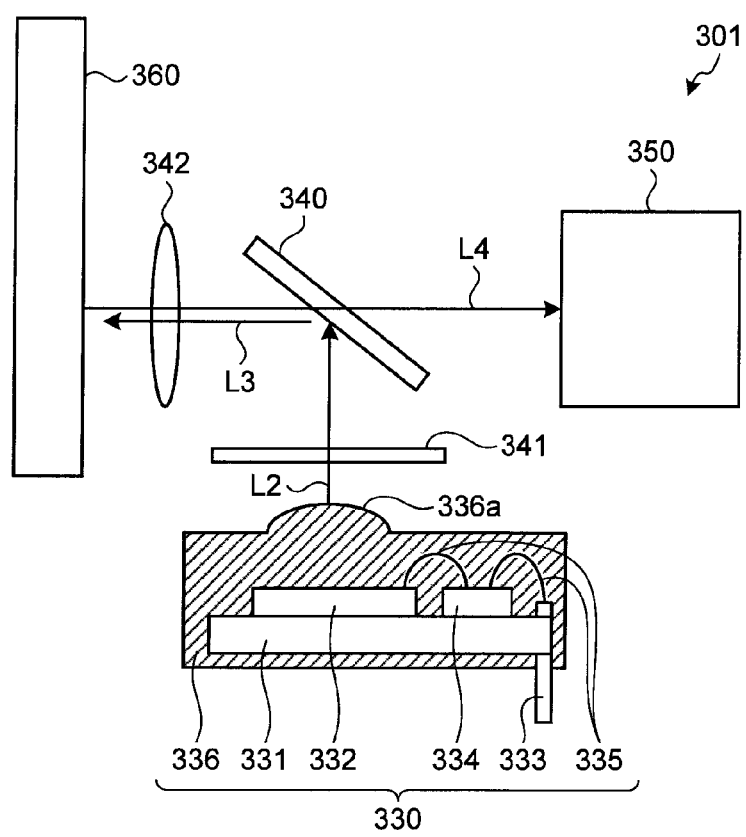
FIG. 12 is a schematic partial cross-sectional view of an optical pickup according to a fourth embodiment of the present invention.

An optical pickup that is a light source including a surface emitting laser according to an embodiment of the present invention and that is used for a writing-reading device of an optical storage medium is now described as a fourth embodiment of the present invention. FIG. 12 is a schematic partial cross-sectional view of an optical pickup 301 according to the fourth embodiment. As shown in FIG. 12, the optical pickup 301 includes a surface emitting laser module 330 including a surface emitting laser 332 according to an embodiment of the present invention, a substrate 331 for mounting the surface emitting laser 332, an electrode 333 provided on the substrate 331, a driving IC 334 mounted on the substrate 331, wires 335 for sequentially connecting the surface emitting laser 332, the driving IC 334, the electrode 333, and a resin 336 for sealing the above elements. The optical pickup 301 also includes a half mirror 340 provided above the surface emitting laser module 330, a diffraction grating 341 provided between the surface emitting laser module 330 and the half mirror 340, a lens 342 provided between the half mirror 340 and an optical storage medium 360, and a light receiving unit 350 provided at the side opposite from the optical storage medium 360 with respect to the half mirror 340.

The surface emitting laser 101 according to the first embodiment may be used as the surface emitting laser 332. The upper portion of the resin 336 is processed into a convex form so as to form a lens 336a. The electrode 333 is electrically connected to the external control circuit (not shown) to control the emission state of the optical pickup 301.

An operation performed by the optical pickup 301 by which information recorded on the optical storage medium 360 is read out will now be described. A bias voltage and a modulation voltage are applied to the surface emitting laser 332 by the driving IC 334 to which electricity and electrical signals are supplied from the external control circuit via the electrode 333 and the wires 335. The surface emitting laser 332 then emits a laser signal light L2 from the upper side. The lens 336a of the resin 336 collimates the laser signal beam L2 to a parallel light (laser signal light L3). The half mirror 340 condenses the laser signal light L3 to a predetermined location on the optical storage medium 360. The laser signal light L3 is then reflected by the optical storage medium 360, thereby a reflected signal light L4 including the information recorded on the optical storage medium 360 is generated. The reflected signal light L4 sequentially passes through the lens 342 and the half mirror 340. The light receiving unit 350 receives the reflected signal light L4. The light receiving unit 350 then converts the reflected signal light L4 to electrical signals, and the converted electrical signals are transmitted to an information processing device (such as personal computer) connected to the writing-reading device, thereby the recorded information is read out.

The optical pickup 301 uses the surface emitting laser 332 according to the embodiment of the present invention capable of outputting high quality optical signals by a simple control. Accordingly, the optical pickup 301 can be made simple, consumes low power, and can be manufactured at low cost.

In the third and fourth embodiments, the surface emitting lasers may be suitably replaced by the surface emitting laser array device in the second embodiment.

In the third and fourth embodiments, the surface emitting laser according to the embodiment of the present invention is applied to the surface emitting laser package for communication or the optical pickup used for the writing-reading device of the optical storage medium. However, the surface emitting laser of the present invention is not limited thereto, and may be used as optical equipment such as measurement equipment, a laser pointer, and an optical mouse, or light sources for scanning exposure provided in a printer, a photoresist equipment or the like, light sources for laser pumping, and light sources for fiber laser processing.

Figure 13:
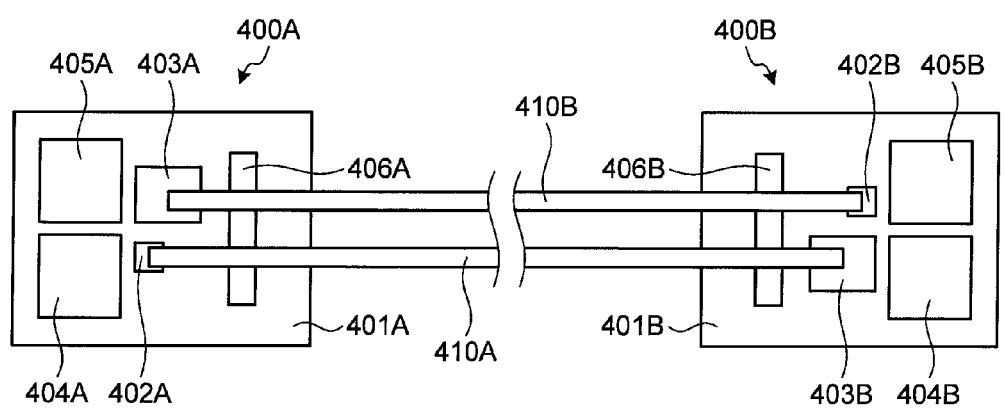
FIG. 13 is a schematic plan view showing a state in which optical transmitter-receiver modules according to a fifth embodiment of the present invention are connected with each other via two optical waveguides.

Various optical modules can be provided by combining the surface emitting laser and the surface emitting laser array of the present invention with an optical waveguide. In the following, an optical transmitter-receiver module that is an optical module using a surface emitting laser according to an embodiment of the present invention will be described as a fifth embodiment of the present invention. FIG. 13 is a schematic plan view showing a state in which optical transmitter-receiver modules 400A and 400B according to the fifth embodiment are connected with each other via two optical waveguides 410A and 410B. In FIG. 13, the optical transmitter-receiver module 400A includes a holding member 401A and elements provided on the holding member 401A, that is, a spacer 406A on which the optical waveguides 410A and 410B such as an optical fiber are mounted for positioning thereof, a surface emitting laser 402A according to an embodiment of the present invention that transmits optical signals via the optical waveguide 410A, a light receiving element 403A that receives the optical signals transmitted through the optical waveguide 410B and that converts the optical signals to electrical signals, a driving circuit 404A that controls the emission state of the surface emitting laser 402A, and an amplifier circuit 405A that amplifies the electrical signals converted by the light receiving element 403A. Emission from the surface emitting laser 402A is controlled by the control signals from an external controlling unit (not shown) via the driving circuit 404A. The electrical signals converted by the light receiving element 403A are transmitted to the controlling unit via the amplifier circuit 405A. To avoid complexity, wire bondings between the driving circuit 404A and the surface emitting laser 402A, and between the amplifier circuit 405A and the light receiving element 403A are omitted.

The optical transmitter-receiver module 400B has the same structure as that of the optical transmitter-receiver module 400A. However, the structure of transmission and the structure of reception are switched from those in the optical transmitter-receiver module 400A. In other words, the optical transmitter-receiver module 400B includes a holding member 401B and elements provided on the holding member 401B, that is, a spacer 406B for positioning the optical waveguides 410A and 410B, a surface emitting laser 402B according to an embodiment of the present invention that transmits optical signals via the optical waveguide 410B, a light receiving element 403B that receives the optical signals transmitted through the optical waveguide 410A and that converts the optical signals to electrical signals, a driving circuit 404B that controls the emission state of the surface emitting laser 402B, and an amplifier circuit 405B that amplifies the electrical signals converted by the light receiving element 403B. Emission from the surface emitting laser 402B is controlled by the control signals from the external controlling unit (not shown) via the driving circuit 404B. The electrical signals converted by the light receiving element 403B are transmitted to the controlling unit via the amplifier circuit 405B.

The optical transmitter-receiver modules 400A and 400B use the surface emitting lasers 402A and 402B according to the embodiment of the present invention capable of outputting high quality optical signals by a simple control. Accordingly, the optical transmission-reception modules 400A and 400B can be made simple, consume low power, and can be manufactured at low cost.

Optical coupling portions between the surface emitting laser 402A or 402B and the optical waveguide 410A or 410B of the optical transmitter-receiver module 400A or 400B shown in FIG. 13 will now be described in detail. In the following, the optical coupling portion is described by using the optical transmitter-receiver module 400A, the surface emitting laser 402A, and the optical waveguide 410A. However, the optical coupling portion may also apply to the combination of the optical transmission-reception module 400B, the surface emitting laser 402B, and the optical waveguide 410B.

Figure 14:
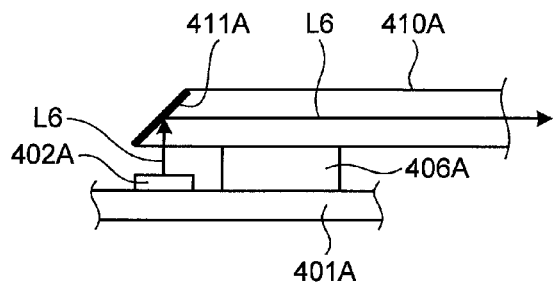
FIG. 14 is a side view of a first example of an optical coupling portion between the surface emitting laser and the optical waveguide of one of the optical transmitter-receiver modules shown in FIG. 13.

FIG. 14 is a side view of a first example of an optical coupling portion between the surface emitting laser 402A and the optical waveguide 410A of the optical transmitter-receiver module 400A shown in FIG. 13. As shown in FIG. 14, an end face of the optical waveguide 410A is formed so as to incline approximately 45 degrees relative to the optical axis. A reflection film 411A is formed on the mirror-finished end face of the optical waveguide 410 as an optical coupling unit. The relative position of the surface emitting laser 402A and the reflection film 411A is positioned by the spacer 406A, and is adjusted so that the surface emitting laser 402A is placed below the refection film 411A. An optical signal L6 emitted from the surface emitting laser 402A is reflected by the reflection film 411A, coupled into the optical waveguide 410A, and propagates through the optical waveguide 410A.

Figure 15:
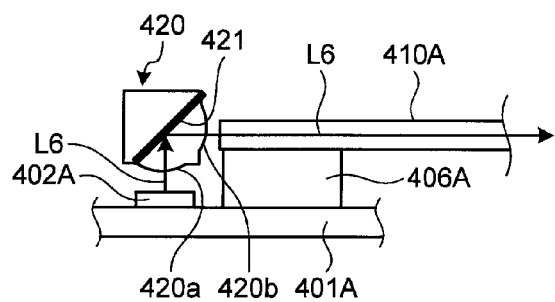
FIG. 15 is a side view of a second example of the optical coupling portion between the surface emitting laser and the optical waveguide.

FIG. 15 is a side view of a second example of the optical coupling portion between the surface emitting laser 402A and the optical waveguide 410A. In the example shown in FIG. 15, a mirror assembly 420 is provided above the surface emitting laser 402A and at the side of the end face of the optical waveguide 410A as an optical coupling unit. The mirror assembly 420 includes an input surface 420a facing the surface emitting laser 402A and an output surface 420b facing the end face of the optical waveguide 410A. A reflection surface 421 is also included in the mirror assembly 420. The optical signal L6 emitted from the surface emitting laser 402A enters the mirror assembly 420 from the input surface 420a, reflected by the reflection surface 421, output from the output surface 420b, coupled at the end face of the optical waveguide 410A, and propagates through the optical waveguide 410A. A micro lens (array) for collimating or condensing may be provided on the input surface 420a and/or the output surface 420b of the mirror assembly 420.

Figure 16:
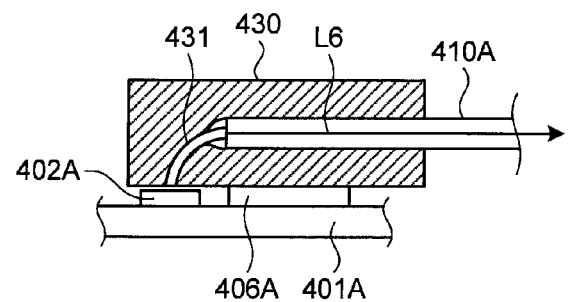
FIG. 16 is a partial cross-sectional side view of a third example of the optical coupling portion between the surface emitting laser and the optical waveguide.

FIG. 16 is a partial cross-sectional side view of a third example of the optical coupling portion between the surface emitting laser 402A and the optical waveguide 410A. In the example shown in FIG. 16, the optical waveguide 410A that is an optical fiber is held in a connector housing 430 mounted on the spacer 406A. A coated optical fiber 431 is bent smoothly as the optical coupling unit, and one end face thereof is connected to the optical waveguide 410A and the other end face thereof is held so as to face the surface emitting laser 402A. The optical signal L6 emitted from the surface emitting laser 402A enters the coated optical fiber 431 from the end surface, propagates through the coated optical fiber 431, coupled into the optical waveguide 410A, and propagates therethrough.

Figure 17:
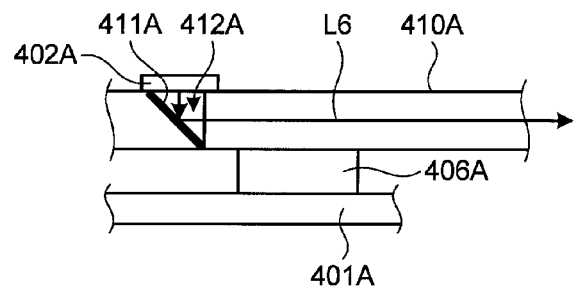
FIG. 17 is a side view of a fourth example of the optical coupling portion between the surface emitting laser and the optical waveguide.

FIG. 17 is a side view of a fourth example of the optical coupling portion between the surface emitting laser 402A and the optical waveguide 410A. In the example shown in FIG. 17, a groove 412A in a wedge shape having an inclined inner surface that is inclined approximately 45 degrees relative to the optical axis is formed on the optical waveguide 410A mounted on the spacer 406A. The reflection film 411A is formed on the mirror-finished inclined inner surface. The groove 412A and the reflection film 411A form the optical coupling unit. The surface emitting laser 402A is directly fabricated on the optical waveguide 410A at a position above the groove 412A. The surface emitting laser 402A is formed so as to emit the optical signal L6 towards the substrate side, in other words, in the downward direction. The optical signal L6 emitted from the surface emitting laser 402A is reflected by the reflection film 411A formed on the inclined inner surface of the groove 412A, coupled into the optical waveguide 410A, and propagates through the optical waveguide 410A.

Figure 18:
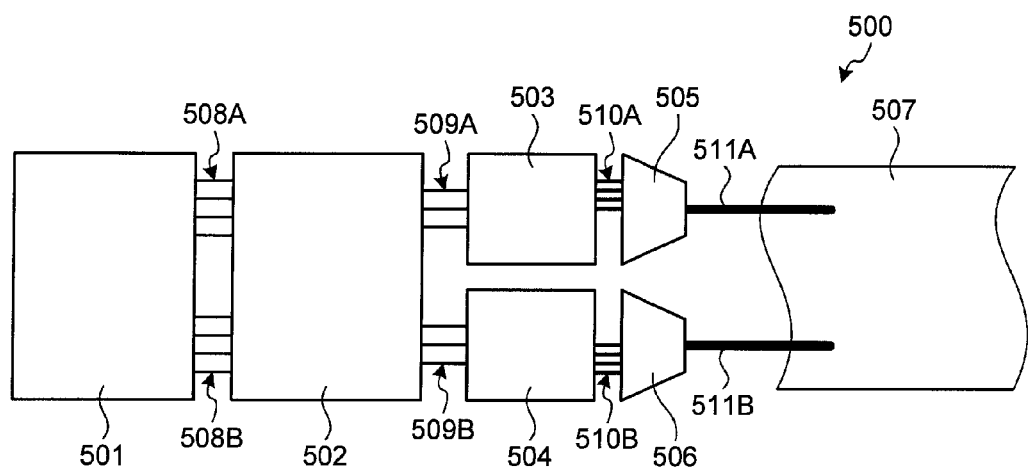
FIG. 18 is a schematic block diagram of a wavelength division multiplexing transmission system according to a sixth embodiment of the present invention.

An optical communication system using a surface emitting laser and a surface emitting laser array according to an embodiment of the present invention will now be described as a sixth embodiment of the present invention. FIG. 18 is a schematic block diagram of a wavelength division multiplexing transmission system 500 according to the sixth embodiment. As shown in FIG. 18, the wavelength division multiplexing transmission system 500 includes a signal generation processing unit 501 such as a computer, a board, or a chip, a communication control circuit 502 that is connected to the signal generation processing unit 501 through electrical wirings 508A and 508B and that includes a central processing unit (CPU), a micro processing unit (MPU), a wavelength control circuit, and the like, a surface emitting laser array 503 and a light receiving element integration unit 504 connected to the communication control circuit 502 through electrical wirings 509A and 509B, respectively, a wavelength division optical multiplexer 505 connected to the surface emitting laser array 503 through an optical fiber array 510A, a wavelength division optical demultiplexer 506 connected to the light receiving element integration unit 504 through an optical fiber array 510B, and a communication object 507 connected to the wavelength division optical multiplexer 505 and the wavelength division optical demultiplexer 506 through each of optical fibers 511A and 511B. The communication object 507 is such as a network, a personal computer (PC), a board, and a chip. The surface emitting laser array 503 is formed by arranging surface emitting lasers according to an embodiment of the present invention having different oscillation wavelengths from one another one-dimensionally or two-dimensionally.

The signal generation processing unit 501 generates electrical signals that should be transmitted to the communication object 507, and transmits the electrical signals to the communication control circuit 502 through the electrical wiring 508A. The communication control circuit 502 supplies driving power to the surface emitting laser array 503 through the electrical wiring 509A. The communication control circuit 502 also supplies different signals to the surface emitting lasers from one another that form the surface emitting laser array 503. Thereby the communication control circuit 502 makes the surface emitting laser array 503 generate optical signals. The optical fibers that are included in the optical fiber array 510A are optically coupled to the surface emitting lasers that are included in the surface emitting laser array 503, and transmit the generated optical signals to the wavelength division optical multiplexer 505 using different optical fibers for each optical signal. The wavelength division optical multiplexer 505 performs wavelength-multiplexing the transmitted optical signals and couples them into one optical fiber 511A. The optical fiber 511A transmits the wavelength multiplexed optical signals to the communication object 507.

The wavelength division optical demultiplexer 506 demultiplexes the wavelength multiplexed optical signals transmitted from the communication object 507 through the optical fiber 511B for each wavelength, and couples them into each optical fiber that is included in the optical fiber array 510B for each optical signal. The optical fiber array 510B transmits the optical signals to the light receiving element integration unit 504. each of the light receiving elements that are included in the light receiving element integration unit 504 are optically coupled into each of the optical fibers that are included in the optical fiber array 510B. The light receiving elements receive the optical signals, convert them into electrical signals, and transmit the electrical signals to the communication control circuit 502 through the electrical wiring 509B. The communication control circuit 502 transmits the electrical signals to the signal generation processing unit 501 through the electrical wiring 508B. The signal generation processing unit 501 performs signal processing on the electrical signals.

The wavelength division multiplexing transmission system 500 uses the surface emitting laser array 503 according to the embodiment of the present invention capable of outputting high quality optical signals by a simple control. Accordingly, the wavelength division multiplexing transmission system 500 can be made simple, and enables to perform wavelength division multiplexing transmission of high density and large capacity at low power consumption and at low cost. Because the optical signals from the surface emitting lasers that are included in the surface emitting laser array 503 are coupled into one optical fiber 511A by the wavelength division optical multiplexer 505, a large capacity signal transmission can be performed with a high throughput using one fiber.

Depending on the intended purpose, the wavelength division multiplexing transmission system 500 may be a parallel transmission system in which the surface emitting laser array 503 and the light receiving element integration unit 504 may be directly connected to the communication object 507 using the optical fiber array. Because the surface emitting laser array of the present invention also has good high frequency modulation characteristics, it is possible to achieve long-distance communication exceeding 200 meters at a transmission rate exceeding 50 gigabits per second.

In the surface emitting laser according to the embodiments described above, the n-type contact layer 3, the n-type cladding layer 5, and the p-type contact layer 12 are formed of GaAs not including Al. The p-type spacer layers 9 and 11, and the p-type high conductivity layer 10 are formed of AlGaAs.

However, if the condition is satisfied that the bandgap energy is reduced from the current confinement layer 8 towards the p-type contact layer 12, and also reduced from the current confinement layer 8 towards the n-type contact layer 3, the compositions of the layers are not limited to those in the embodiments, but for example, the n-type contact layer 3 may be formed of AlGaAs. If the condition that the bandgap energy is reduced is satisfied, any semiconductor layer other than the semiconductor layers in the embodiments may be included. The method of reducing the bandgap energy is not limited to the method of reducing the Al composition, but may be a method of reducing the bandgap energy by adjusting the other compositions.

The condition in which the bandgap energy is reduced from the current confinement layer 8 towards the n-type contact layer 3 is applied to the layers excluding at least the quantum well layer 6a of the active layer 6. Accordingly, regardless of the bandgap energy of the quantum well layer 6a of the active layer 6, the above condition is satisfied if the bandgap energy is reduced from the current confinement layer 8 towards the n-type contact layer 3 while bypassing the quantum well layer 6a of the active layer 6. The active layer 6 may be replaced by an active layer having a quantum dot structure. In this case, the above condition is satisfied if the bandgap energy is reduced from the current confinement layer 8 towards the n-type contact layer 3 while bypassing the quantum dot of the active layer. The p-type cladding layer 7 may include other chemical elements or materials capable of reducing the mobility of the carriers instead of Al.

In the embodiments described above, the entire upper DBR mirror is formed of the dielectric multilayer film. However, at least a part of the upper DBR mirror may be formed of the dielectric multilayer film and the other portion may be formed of a semiconductor multilayer film. The semiconductor material for forming the surface emitting laser is not limited to the AlGaAs based material and the GaInAs based material, but the other semiconductor materials such as a GaN based material and an InP based material may also be used corresponding to the intended laser oscillation wavelength. In the embodiments, the GaAs substrate is used. However, an InP substrate may be used instead. At that time, the layer being oxidized as the current confinement layer is AlGaInAs or AlInAs, and the oxide thereof may be the current confinement portion. The layers from the current confinement layer to the p-type contact layer, and the layers from the current confinement layer to the n-type contact layer may be formed of AlGaInAs, and the Al composition may be reduced towards the contact layers. When a GaN substrate is used, the layer being oxidized as the current confinement layer may be AlGaN or AlN, and the oxide thereof may be the current confinement portion. The layers from the current confinement layer to the p-type contact layer, and the layers from the current confinement layer to the n-type contact layer may be formed of GaN or AlGaN, and the Al composition may be reduced towards the contact layers.

As described above, the surface emitting laser, the surface emitting laser array, the light source, and the optical module according to the present invention are suitable to be applied to fields such as optical interconnection and optical pickup.

Although the invention has been described with respect to specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A surface emitting laser, comprising:
a substrate;
a lower multilayer film reflection mirror formed on the substrate and comprising a periodic structure of a high refractive index layer and a low refractive index layer;
a first conductivity type contact layer formed on the lower multilayer film reflection mirror;
a first conductivity type cladding layer formed on the first conductivity type contact layer;
an active layer formed on the first conductivity type cladding layer;
a second conductivity type cladding layer formed on the active layer;
a current confinement layer formed on the second conductivity type cladding layer and including a current injection portion made of a material including aluminum and a current confinement portion made of aluminum oxide formed by a selective thermal oxidation process;
a second conductivity type contact layer formed on the current confinement layer;
an upper multilayer film reflection mirror formed on the second conductivity type contact layer and comprising a periodic structure of a high refractive index layer and a low refractive index layer;
a second conductivity type side electrode formed on the second conductivity type contact layer; and
a first conductivity type side electrode formed on the first conductivity type contact layer, wherein
layers from immediately above the current confinement layer to the second conductivity type contact layer comprise a composition in which bandgap energy is reduced towards the second conductivity type contact layer in a stacking direction,
layers from immediately below the current confinement layer to the first conductivity type contact layer comprise a composition in which bandgap energy is reduced towards the first conductivity type contact layer in the stacking direction, while bypassing a quantum well layer or a quantum dot of the active layer,
the second conductivity type cladding layer includes a material for reducing mobility of a carrier, and
at least one of (i) the bandgap energy of the layers from immediately above the current confinement layer to the second conductivity type contact layer and (ii) the bandgap energy of the layers from immediately below the current confinement layer to the first conductivity type contact layer is reduced in a stepwise manner.

2. A surface emitting laser, comprising:
a substrate;
a lower multilayer film reflection mirror formed on the substrate and comprising a periodic structure of a high refractive index layer and a low refractive index layer;
a first conductivity type contact layer formed on the lower multilayer film reflection mirror;
a first conductivity type cladding layer formed on the first conductivity type contact layer;
an active layer formed on the first conductivity type cladding layer;
a second conductivity type cladding layer formed on the active layer;
a current confinement layer formed on the second conductivity type cladding layer and including a current injection portion made of a material including aluminum and a current confinement portion made of aluminum oxide formed by a selective thermal oxidation process;

a second conductivity type contact layer formed on the current confinement layer;

an upper multilayer film reflection mirror formed on the second conductivity type contact layer and comprising a periodic structure of a high refractive index layer and a low refractive index layer;

a second conductivity type side electrode formed on the second conductivity type contact layer; and a first conductivity type side electrode formed on the first conductivity type contact layer, wherein layers from immediately above the current confinement layer to the second conductivity type contact layer comprise a composition in which bandgap energy is reduced towards the second conductivity type contact layer in a stacking direction, layers from immediately below the current confinement layer to the first conductivity type contact layer comprise a composition in which bandgap energy is reduced towards the first conductivity type contact layer in the stacking direction, while bypassing a quantum well layer or a quantum dot of the active layer, the second conductivity type cladding layer includes a material for reducing mobility of a carrier the substrate is formed of GaAs, the current injection portion is formed of $Al_{1-x}Ga_xAs$ ($0 \leq x < 1$) and the current confinement portion is formed of $(Al_{1-x}Ga_x)_2O_3$, the layers from immediately above the current confinement layer to the second conductivity type contact layer are formed of $Al_{1-y}Ga_yAs$ ($x < y \leq 1$) with an Al composition that is monotonously reduced towards the second conductivity type contact layer in the stacking direction, the layers from immediately below the current confinement layer to the first conductivity type contact layer are formed of $Al_{1-z}Ga_zAs$ ($x < z \leq 1$) with an Al composition that is reduced towards the first conductivity type contact layer in the stacking direction while bypassing the quantum well layer or the quantum dot of the active layer, and the second conductivity type cladding layer is formed of $Al_{1-z}Ga_zAs$ ($z \neq 1$).

3. The surface emitting laser according to claim 1, further comprising a second conductivity type high conductivity layer formed between the current confinement layer and the second conductivity type contact layer.

4. The surface emitting laser according to claim 3, wherein a value obtained by dividing a thickness of the second conductivity type high conductivity layer by a resistivity thereof is equal to or more than $7 \times 10^{-4}$ [1/Ω].

5. The surface emitting laser according to claim 3, wherein the second conductivity type high conductivity layer has a carrier concentration of equal to or more than $3 \times 10^{19}$ cm$^{-3}$ and equal to or less than $1 \times 10^{21}$ cm$^{-3}$.

6. The surface emitting laser according to claim 1, wherein a number of hetero interfaces present between the second conductivity type side electrode and the active layer is from 3 to 30.

7. The surface emitting laser according to claim 1, wherein a distance from a center of the active layer to a center of the current confinement layer in the stacking direction is within a range from λ/4n to 7λ/4n, where λ denotes a laser oscillation wavelength and n denotes an average refractive index from the active layer to the current confinement layer.

8. The surface emitting laser according to claim 1, wherein at least a part of the upper multilayer film reflection minor is formed of a dielectric material.

9. The surface emitting laser according to claim 1, wherein the second conductivity type cladding layer is doped with a second conductivity type dopant and the first conductivity type cladding layer is doped with a first conductivity type dopant.

10. The surface emitting laser according to claim 1, wherein when a modulation rate is from 2.5 gigabits per second to 40 gigabits per second, the surface emitting laser is driven at a modulation region within ±3 milliamperes around a bias current as a center during modulation.

11. The surface emitting laser according to claim 1, wherein when a modulation rate is from 2.5 gigabits per second to 40 gigabits per second, a threshold current is equal to or less than 1.2 milliamperes, and a modulation voltage around a bias current as a center during modulation is within ±0.2 volts.

12. The surface emitting laser according to claim 1, wherein when a modulation rate is from 2.5 gigabits per second to 40 gigabits per second, a threshold current is equal to or less than 1.2 milliamperes, and a modulation voltage around a bias current as a center during modulation is within ±0.1 volts.

13. The surface emitting laser according to claim 1, wherein in current-differential resistance characteristics, a difference between a maximum value and a minimum value of differential resistance at same temperature is equal to or less than 17 percent of the maximum value, and the differential resistance is flat across a range of currents from 1 milliampere to 3 milliamperes through equal to or more than 10 milliamperes.

14. The surface emitting laser according to claim 10, wherein the modulation rate is from 2.5 gigabits per second to 10 gigabits per second, and a variation of differential resistance in a modulation region around the bias current as the center during modulation to obtain an extinction ratio of equal to or more than 4 decibels is equal to or less than 15 ohms.

15. The surface emitting laser according to claim 14, wherein the variation of the differential resistance relative to a change in ambient temperature from 25 degrees Celsius to 90 degrees Celsius is equal to or less than 15 ohms.

16. The surface emitting laser according to claim 10, wherein the modulation rate is from 2.5 gigabits per second to 10 gigabits per second, and differential resistance in a modulation region around the bias current as the center to obtain an extinction ratio of equal to or more than 4 decibels is equal to or less than 70 ohms.

17. The surface emitting laser according to claim 16, wherein the differential resistance relative to a change in ambient temperature from 25 degrees Celsius to 90 degrees Celsius is equal to or less than 70 ohms.

18. A surface emitting laser array, comprising 4 to 15 elements of the surface emitting laser according to claim 1 arranged in a one-dimensional or two-dimensional array.

19. A light source, comprising:
the surface emitting laser according to claim 1; and
a controller configured to apply a bias voltage and a modulation voltage with approximately same amplitude in positive and negative directions around the bias voltage as a center to the surface emitting laser.

20. An optical module, comprising:
the surface emitting laser according to claim 1;
an optical waveguide configured to propagate laser light emitted from the surface emitting laser; and
an optical coupling unit configured to couple the laser light into the optical waveguide.

21. The surface emitting laser according to claim 2, wherein at least one of (i) the bandgap energy of the layers from immediately above the current confinement layer to the second conductivity type contact layer and (ii) the bandgap energy of the layers from immediately below the current confinement layer to the first conductivity type contact layer is reduced in a continuous manner.

22. The surface emitting laser according to claim 2, further comprising a second conductivity type high conductivity layer formed between the current confinement layer and the second conductivity type contact layer.

23. The surface emitting laser according to claim 22, wherein a value obtained by dividing a thickness of the second conductivity type high conductivity layer by a resistivity thereof is equal to or more than $7 \times 10^{-4}$ [1/Ω].

24. The surface emitting laser according to claim 22, wherein the second conductivity type high conductivity layer has a carrier concentration of equal to or more than $3 \times 10^{19}$ cm$^{-3}$ and equal to or less than $1 \times 10^{21}$ cm$^{-3}$.

25. The surface emitting laser according to claim 2, wherein a number of hetero interfaces present between the second conductivity type side electrode and the active layer is from 3 to 30.

26. The surface emitting laser according to claim 2, wherein a distance from a center of the active layer to a center of the current confinement layer in the stacking direction is within a range from λ/4n to 7λ/4n, where λ denotes a laser oscillation wavelength and n denotes an average refractive index from the active layer to the current confinement layer.

27. The surface emitting laser according to claim 2, wherein at least a part of the upper multilayer film reflection minor is formed of a dielectric material.

28. The surface emitting laser according to claim 2, wherein the second conductivity type cladding layer is doped with a second conductivity type dopant and the first conductivity type cladding layer is doped with a first conductivity type dopant.

29. The surface emitting laser according to claim 2, wherein when a modulation rate is from 2.5 gigabits per second to 40 gigabits per second, the surface emitting laser is driven at a modulation region within ±3 milliamperes around a bias current as a center during modulation.

30. The surface emitting laser according to claim 2, wherein when a modulation rate is from 2.5 gigabits per second to 40 gigabits per second, a threshold current is equal to or less than 1.2 milliamperes, and a modulation voltage around a bias current as a center during modulation is within ±0.2 volts.

31. The surface emitting laser according to claim 2, wherein when a modulation rate is from 2.5 gigabits per second to 40 gigabits per second, a threshold current is equal to or less than 1.2 milliamperes, and a modulation voltage around a bias current as a center during modulation is within ±0.1 volts.

32. The surface emitting laser according to claim 2, wherein in current-differential resistance characteristics, a difference between a maximum value and a minimum value of differential resistance at same temperature is equal to or less than 17 percent of the maximum value, and the differential resistance is flat across a range of currents from 1 milliampere to 3 milliamperes through equal to or more than 10 milliamperes.

33. The surface emitting laser according to claim 29, wherein the modulation rate is from 2.5 gigabits per second to 10 gigabits per second, and a variation of differential resistance in a modulation region around the bias current as the center during modulation to obtain an extinction ratio of equal to or more than 4 decibels is equal to or less than 15 ohms.

34. The surface emitting laser according to claim 33, wherein the variation of the differential resistance relative to a change in ambient temperature from 25 degrees Celsius to 90 degrees Celsius is equal to or less than 15 ohms.

35. The surface emitting laser according to claim 29, wherein the modulation rate is from 2.5 gigabits per second to 10 gigabits per second, and differential resistance in a modulation region around the bias current as the center to obtain an extinction ratio of equal to or more than 4 decibels is equal to or less than 70 ohms.

36. The surface emitting laser according to claim 35, wherein the differential resistance relative to a change in ambient temperature from 25 degrees Celsius to 90 degrees Celsius is equal to or less than 70 ohms.

37. A surface emitting laser array, comprising 4 to 15 elements of the surface emitting laser according to claim 2 arranged in a one-dimensional or two-dimensional array.

38. A light source, comprising:
the surface emitting laser according to claim 2; and
a controller configured to apply a bias voltage and a modulation voltage with approximately same amplitude in positive and negative directions around the bias voltage as a center to the surface emitting laser.

39. An optical module, comprising:
the surface emitting laser according to claim 2;
an optical waveguide configured to propagate laser light emitted from the surface emitting laser; and
an optical coupling unit configured to couple the laser light into the optical waveguide.

* * * * *